United States Patent
Peng et al.

(10) Patent No.: US 10,468,630 B2
(45) Date of Patent: Nov. 5, 2019

(54) FLEXIBLE DISPLAY PANELS AND MANUFACTURING METHODS THEREOF

(71) Applicant: Wuhan China Star Optoelectronics Technology Co., Ltd., Wuhan, Hubei (CN)

(72) Inventors: Simin Peng, Guangdong (CN); Jiangjiang Jin, Guangdong (CN); Hsiang Lun Hsu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 104 days.

(21) Appl. No.: 15/567,566

(22) PCT Filed: May 3, 2017

(86) PCT No.: PCT/CN2017/082916
§ 371 (c)(1),
(2) Date: Oct. 18, 2017

(87) PCT Pub. No.: WO2018/152967
PCT Pub. Date: Aug. 30, 2018

(65) Prior Publication Data
US 2018/0294439 A1    Oct. 11, 2018

(51) Int. Cl.
*H01L 51/00* (2006.01)
*H01L 51/50* (2006.01)
(Continued)

(52) U.S. Cl.
CPC ........ *H01L 51/5265* (2013.01); *H01L 51/001* (2013.01); *H01L 51/0035* (2013.01);
(Continued)

(58) Field of Classification Search
None
See application file for complete search history.

(56) References Cited

U.S. PATENT DOCUMENTS

| 6,235,629 B1 * | 5/2001 | Takenaka .......... H01L 21/76808 |
| | | 257/E21.579 |
| 2008/0067926 A1 | 3/2008 | Mizuno |

(Continued)

FOREIGN PATENT DOCUMENTS

| CN | 101165912 A | 4/2008 |
| CN | 203644825 U | 6/2014 |

*Primary Examiner* — Thien F Tran
(74) *Attorney, Agent, or Firm* — Andrew C. Cheng

(57) ABSTRACT

The present disclosure relates to the field of liquid crystal display technology, and more particularly, to the flexible display panel and the manufacturing method thereof. The method includes forming the polymer on the anode layer from vapor of the organic dimer as the micro-cavity adjusting layer by the chemical vapor deposition method at the controlled temperature between 650° C. to 750° C. The structural formula of the organic dimer is as shown in Formula 1, wherein R is selected from one of H, F, Cl, and Br. The cathodic protective layer and the encapsulation layer can be formed by the same material and processes.

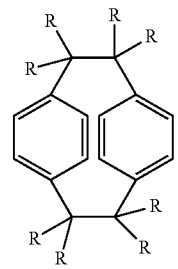

Formula 1

The present disclosure discloses preparing the micro-cavity adjustment layer, the cathodic protective layer, and the
(Continued)

encapsulation layer of the flexible OLED with the same material, which can simplify the preparation processes.

16 Claims, 2 Drawing Sheets

(51) Int. Cl.
    *H01L 51/52*     (2006.01)
    *H01L 51/56*     (2006.01)

(52) U.S. Cl.
    CPC ...... *H01L 51/0097* (2013.01); *H01L 51/5012* (2013.01); *H01L 51/5072* (2013.01); *H01L 51/5088* (2013.01); *H01L 51/5209* (2013.01); *H01L 51/5225* (2013.01); *H01L 51/5256* (2013.01); *H01L 51/5253* (2013.01); *H01L 51/56* (2013.01); *H01L 2251/5338* (2013.01); *H01L 2251/556* (2013.01); *H01L 2251/558* (2013.01)

(56) References Cited

U.S. PATENT DOCUMENTS

2012/0098412 A1    4/2012  Shin
2013/0116482 A1*  5/2013  Lin ......................... C07C 17/14
                                              570/144

* cited by examiner

FLEXIBLE DISPLAY PANELS AND MANUFACTURING METHODS THEREOF

BACKGROUND OF THE INVENTION

1. Field of the Invention

The present disclosure relates to the field of liquid crystal display technology, and more particularly, to a flexible display panel and a manufacturing method thereof.

2. Discussion of the Related Art

With the development of OLED display technology matures, the vast number of consumers experience the huge difference between the OLED display and the traditional LCD display, followed by the rapid growing of OLED consumer market. Because of the characteristics of OLED self-luminous, making feature of short response time, high contrast, wide viewing angle, wide color gamut, light display panel, and being foldable etc. can be achieved. In particular, the feature of OLED display panel being foldable, brings the subversive concept to the consumer. Therefore, the flexible (foldable) OLED in recent years is the mainstream of researching in the industry.

The foldable display panel poses a challenge to the material and the manufacturing process of the components of the electronic device itself. In traditional manufacturing processes of flexible OLED, the micro-cavity adjustment layer, the cathodic protective layer and the packing layer are made of different materials and by different processes. The process is relatively cumbersome. Not only the numerous types of material need different manufacturing apparatuses and reaction conditions, but also the cost of the transport between the various links is also high, which is not conducive to lower production costs.

SUMMARY

The present disclosure relates to a manufacturing method of the flexible display panel, which can simplify the preparation processes and save the costs.

In one respect, a manufacturing method a flexible display panel includes the steps of: forming an anode layer on a substrate, wherein forming a polymer on the anode layer from vapor of an organic dimer as a micro-cavity adjusting layer by a chemical vapor deposition method at a controlled temperature between 650° C. to 750° C.; and the structural formula of the organic dimer is as shown in Formula 1,

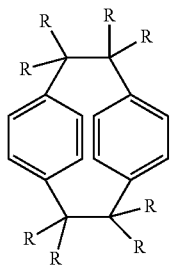

Formula 1 wherein R is selected from one of H, F, Cl, and Br; forming a hole injection layer on the micro-cavity adjustment layer; forming an organic emission layer on the hole injection layer; forming an electron transport layer on the organic emission layer; and forming a cathode layer on the electron transport layer.

Wherein the manufacturing method the flexible display panel further includes depositing the organic dimer on the cathode layer as a cathodic protective layer by a chemical vapor deposition method at a controlled temperature between 100° C. to 150° C.

Wherein the manufacturing method the flexible display panel further includes: preparing a protective layer preparation: forming n protective layers on the cathode protective, n being an integer greater than 0, the protective layer includes a water-blocking layer and a buffer layer sequentially deposited from bottom to top, and a top water-blocking layer is deposited on the n-th layer of the protective layer.

Wherein the manufacturing method the flexible display panel further includes the step of preparing a encapsulation layer by depositing the organic dimer on the protecting layer by a chemical vapor deposition method at a controlled temperature between 100° C. to 150° C.

Wherein the chemical vapor deposition method is one of plasma enhanced chemical vapor deposition, high density plasma chemical vapor deposition, and inductively coupled plasma chemical vapor deposition.

Wherein the chemical vapor deposition method is one of plasma enhanced chemical vapor deposition, high density plasma chemical vapor deposition, and inductively coupled plasma chemical vapor deposition.

Wherein the chemical vapor deposition method is one of plasma enhanced chemical vapor deposition, high density plasma chemical vapor deposition, and inductively coupled plasma chemical vapor deposition.

Wherein the chemical vapor deposition method is one of plasma enhanced chemical vapor deposition, high density plasma chemical vapor deposition, and inductively coupled plasma chemical vapor deposition.

In another aspect, a flexible display panel includes from bottom to top: a substrate, an anode layer, a micro-cavity adjustment layer, a hole injection layer, an organic emission layer, an electron transport layer and a cathode layer, wherein the material of the micro-cavity adjustment layer is a polymer formed by an organic dimer, and the organic dimer as well as the polymer formed therefrom are respectively represented by Formula 1 and Formula 2,

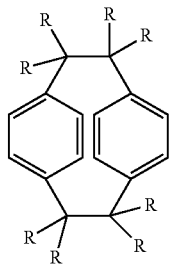

Formula 1

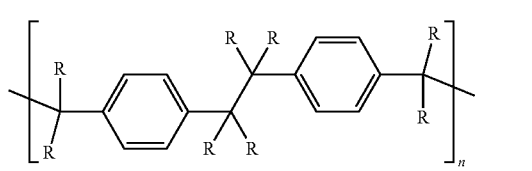

Formula 2 wherein R is selected from one of H, F, Cl, and Br.

Wherein the flexible display panel further includes a cathode protective layer deposited on the cathode protective layer, and the material of the cathode protective layer being an organic dimer as shown in Formula 1.

Wherein the flexible display panel further includes n protective layers sequentially deposited on the cathode protection layer, n being an integer greater than 0; a top water-blocking layer deposited on the n-th layer of the protective layer; and the protective layer includes a buffer layer and a water-blocking layer arranged in the upper and lower layers.

Wherein the flexible display panel further includes a encapsulation layer provided on the protective layer, the material of the encapsulation layer being the organic dimer as shown in Formula 1.

Wherein the thickness of the micro-cavity adjustment layer, the cathode protective layer, and the encapsulation layer is from 0.1 to 10 μm.

Wherein the thickness of the micro-cavity adjustment layer, the cathode protective layer, and the encapsulation layer is 0.1 to 10 μm.

Wherein the thickness of the micro-cavity adjustment layer, the cathode protective layer, and the encapsulation layer is 0.1 to 10 μm.

Wherein the thickness of the micro-cavity adjustment layer, the cathode protective layer, and the encapsulation layer is 0.1 to 10 μm.

The present disclosure discloses applying poly(tetrafluoro-p-xylene) to the preparation of the micro-cavity adjustment layer, the cathodic protective layer, and the encapsulation layer of the flexible OLED by changing the process conditions, which improves the device lightening effect, enhances the water resistance and anti-oxidation of the packed layer, reduces the driving voltage to improve the device operating stability. At the same time, the difficulty of the process can also be reduced without the need to replace the raw materials, and the numeral processes can be completed in one chamber of CVD to complete, which greatly reduces the OLED process steps.

DETAILED DESCRIPTION OF THE EMBODIMENTS

Hereinafter, embodiments of the present disclosure will be described in detail with reference to the drawings. However, the invention may be embodied in many different forms and the present disclosure should not be construed as limited to the specific embodiments set forth herein. In contrast, the embodiments are provided to explain the principles of the present disclosure and the practical application thereof so as to enable the skilled persons in the art to understand the various embodiments of the present disclosure and various modifications that are suitable for a particular intended application.

Embodiment 1

Figure 1:
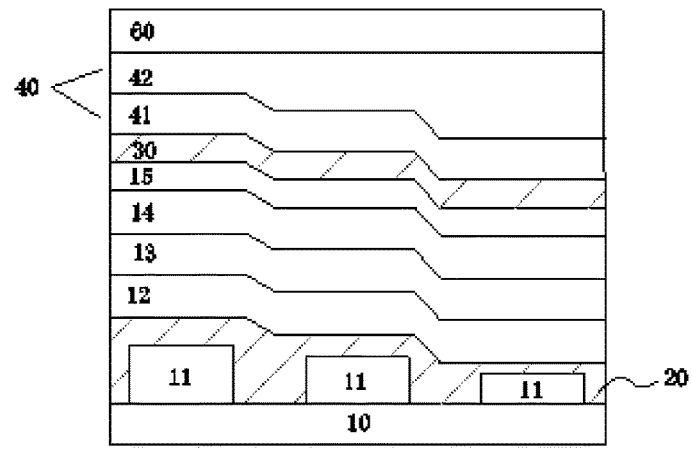
FIG. 1 is a structure diagram illustrating the flexible display panel according to the first embodiment of the present disclosure.

The present disclosure provides a flexible display panel including, as shown in FIG. 1, at least a substrate 10, an anode layer 11 (semiconductor transparent conductive layer, referred to as ITO), a micro-cavity adjustment layer 20 covering the anode layer 11, a hole injection layer 12, an organic emission layer 13, an electron transport layer 14, and a cathode layer 15.

The micro-cavity adjustment layer 20 is mainly used to enhance the current density, brightness, reduce the driving voltage of the device while improve the operating stability of the device. In the present disclosure, the material of the micro-cavity adjustment layer is a polymer formed by an organic dimer. The structural formula of the organic dimer and the polymer formed therefrom are represented by Formula 1 and Formula 2, respectively:

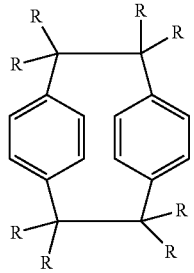

Formula 1

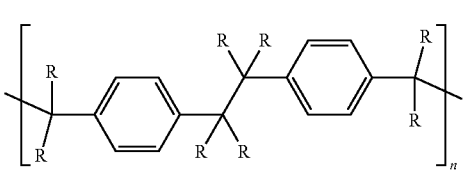

Formula 2

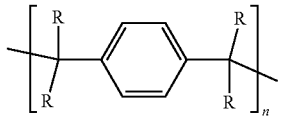

Formula 3

R represents at least one of H, F, Cl, and Br. The compound of Formula 1 can be pyrolyzed to a free radical at high temperature to re-polymerize the polymer of Formula 2 where the molecular weight is larger. If R in the structure of Formula 1 is derived from the same atom, for example, the organic dimer is preferably the dimer of tetrafluoro-p-xylene or the dimerization of tetrabromo-p-xylene, the structure of Formula 2 can also be further simplified and expressed as Formula 3. For example, the corresponding polymer is poly(tetrafluoro-p-xylene), and poly(tetrabromo-p-xylene).

The cathode protective layer 30 is further deposited on the surface of the cathode layer 15, mainly for protecting the cathode layer and improving the light transmittance of the device. In the present disclosure, the cathode protective layer 30 is made of the organic dimer as shown in Formula 1.

In order to further protect the display panel, there are n protective layers 40 formed in turn on the cathode protective layer 30, and n is an integer greater than zero. In the present embodiment, n=1. Each of the protective layers 40 includes a water-blocking layer 42 and a buffer layer 41 provided in the upper and lower layers. The buffer layer 41 is used to cushion the stress of the device during bending and folding, and the water-blocking layer 42 is used to increase the waterproof function of the display panel.

The top water-blocking layer 60 is further provided on the n-th layer of the protective layer 40 for direct contact with the user. The material of the top water-blocking layer 60 and the water-blocking layer 42 can be the same or different, and are generally preferably inorganic hydrophobic materials. The material of the buffer layer 41 is generally preferably the organic material.

The manufacturing method of the flexible display panel of the present embodiment is described below.

In step S1, a semiconductor transparent electrode film (ITO) is formed on the glass substrate as the anode layer. Specifically, a patterning ITO electrode layer is formed on the glass substrate by pretreatment cleaning of ITO, photolithography, and etc.

In step S6, an organic buffer layer is prepared by ink jet printing (IJP) or PECVD. The material of the buffer layer is selected from Acryl, Hexamethyldisiloxane (HMDSO), polyacrylates and derivatives thereof, polycarbonate and derivatives thereof, polystyrene, and the like, which can be used to cushion the stress of the device during bending and folding, After Step S5 and S6, the preparation of the first protective layer is completed.

In Step S7, the top water-blocking layer is prepared. The top water-blocking layer is formed on the buffer layer using the same material and process conditions as those in step S5.

Equation 2

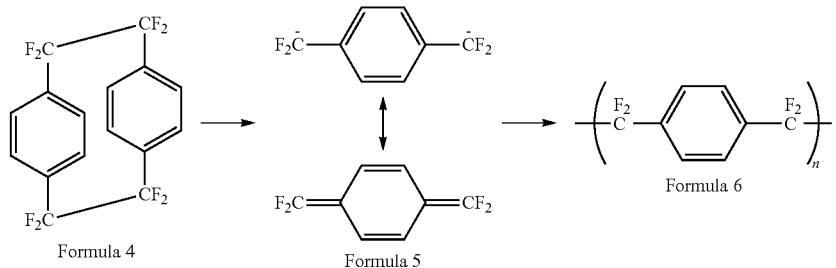

Formula 4    Formula 5    Formula 6

In step S2, the micro-cavity adjustment layer is formed on the anode layer. As shown in Equation 2, by means of the chemical vapor deposition method, the temperature in the reaction chamber is controlled between 100 to 150° C. so as to evaporate the dimer of tetrafluoro-p-xylene (see Formula 4, referred to as $AF_4$). The temperature is then raised to 650 to 750° C., which makes $AF_4$ vapor be cracked into the free radical (Formula 5) and finally be deposited on the anode layer and polymerized to form a polymer (as Formula 6) as the micro-cavity adjustment layer covering the anode layer. The $AF_4$, which forms the micro-cavity adjustment layer, has the film thickness between 0.1 to 10 μm, and is able to enhance the device's current density, brightness, and reduce the drive voltage, while improves the stability of device.

The chemical vapor deposition method employed in the present step can be any of the plasma enhanced chemical vapor deposition (PECVD), the high density plasma chemical vapor deposition (HDPCVD), and the inductively coupled plasma chemical vapor deposition (ICPCVD).

In step S3, as shown in FIG. 1, the hole injection layer, the organic emission layer, the electron transport layer and the cathode layer are sequentially deposited on the micro-cavity adjustment layer by the vacuum evaporation process.

Step S4, by means of the chemical vapor deposition method, the temperature in the reaction chamber is controlled between 100 to 150° C. so as to evaporate the dimer of tetrafluoro-p-xylene (see Formula 4, referred to as $AF_4$). The $AF_4$ film is then deposited on the cathode layer as the cathodic protective layer. The $AF_4$, which forms the cathodic protective layer, has the film thickness between 0.1 to 10 μm, the light transmittance of more than 98%, the refractive index of 1.6 to 1.8, and is capable of protecting the cathode and improving the light transmittance of the device.

Step S5, the water-blocking layer is formed on the cathodic protective layer by PECVD, atomic layer deposition process (ALD), pulsed laser deposition (PLD) or Sputter process. The material of the water-blocking layer is, for example, at least one of $Al_2O_3$, $TiO_2$, SiNx, SiCNx and SiOx.

In the present embodiment, the material of the top water-blocking layer is the same as that of the water-blocking layer.

Afterward, the flexible display panel of the present embodiment is obtained.

Embodiment 2

Figure 2:
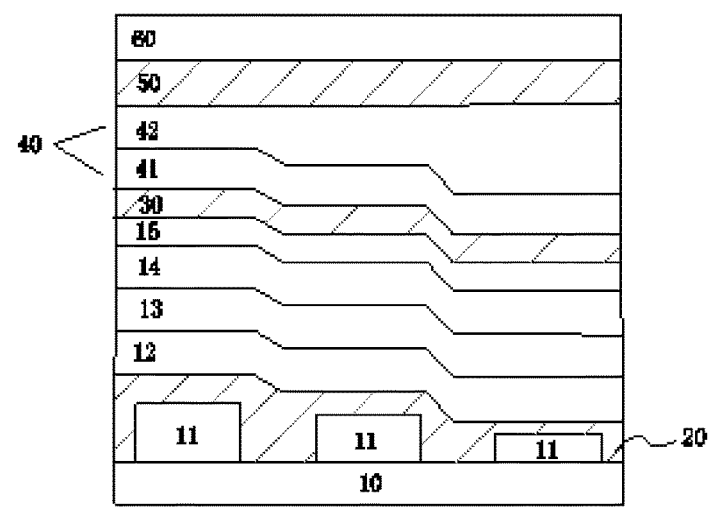
FIG. 2 is a structure diagram illustrating the flexible display panel according to the second embodiment of the present disclosure.

In the present embodiment, as shown in FIG. 2, a encapsulation layer 50 is additionally provided between the protective layer 40 and the top water-blocking layer 60, which is different from the embodiment 1.

The protective layer 40, the encapsulation layer 50, and the top water-blocking layer 60 on the encapsulation layer 50 form the protective structure of the "water blocking layer-buffer layer -$AF_4$— water blocking layer". The encapsulation layer is mainly used to improve the capacity of anti-water and anti-oxidation of the encapsulation layer and prolong the service life of the OLED device. In the present embodiment, the material of the encapsulation layer is the organic dimer as shown in Formula 1.

In order to obtain the structure of the present embodiment, the manufacturing steps are adjusted as follows.

Steps S1 to S6 are referred to the embodiment 1. The preparation of one of the protective layer 40 is completed after steps S5 and S6.

In step S7, by means of the chemical vapor deposition method, the temperature in the reaction chamber is controlled between 100 to 150° C. so as to evaporate the dimer of tetrafluoro-p-xylene (see Formula 4, referred to as $AF_4$). The $AF_4$ film is then deposited on the buffer layer as the encapsulation layer. The encapsulation layer has the film thickness between 0.1 to 10 μm, the light transmittance of more than 98%, the refractive index of 1.4 to 1.6, which is capable of improving the capacity of anti-water and anti-oxidation of the encapsulation layer and prolong the service life of the OLED device.

In step S8, the top water-blocking layer is prepared. The top water-blocking layer is formed on the encapsulation layer using the same material and process conditions as those in step S5. In the present embodiment, the material of the top water-blocking layer is the same as that of the water-blocking layer.

Afterward, the flexible display panel of the present embodiment is obtained.

Embodiment 3

Figure 3:
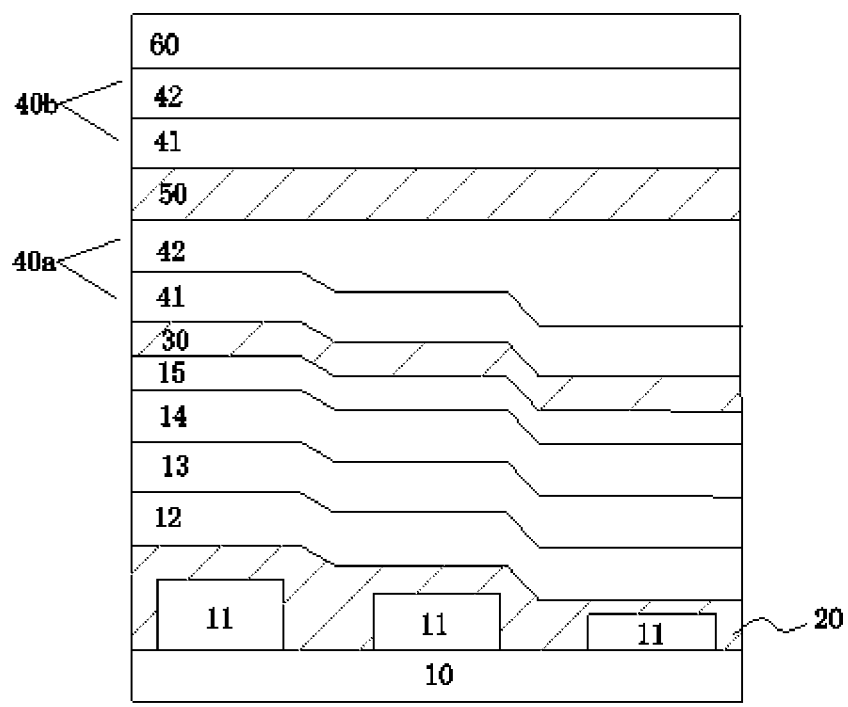
FIG. 3 is a structure diagram illustrating the flexible display panel according to the third embodiment of the present disclosure.

In the present embodiment, as shown in FIG. 3, not only the first protective layer 40a is formed, but also the second protective layer 40b is formed between the encapsulation layer 50 and the top water-blocking layer 60, which is different from the embodiment.

In order to obtain the structure of the present embodiment, the manufacturing steps are adjusted as follows.

Steps S1 to S6 are referred to the embodiment 1. The preparation of the first protective layer 40a is completed after steps S5 and S6.

In step S7, by means of the chemical vapor deposition method, the temperature in the reaction chamber is controlled between 100 to 150° C. so as to evaporate the dimer of tetrafluoro-p-xylene (see Formula 4, referred to as $AF_4$). The $AF_4$ film is then deposited on the buffer layer as the encapsulation layer. The encapsulation layer has the film thickness between 0.1 to 10 μm, the light transmittance of more than 98%, the refractive index of 1.4 to 1.6, which is capable of improving the capacity of anti-water and anti-oxidation of the encapsulation layer and prolong the service life of the OLED device.

In step S8, the steps S5 and S6 are repeated once, and the second protective layer 40b is formed on the encapsulation layer.

In step S9, the top water-blocking layer is prepared. The top water-blocking layer is formed on the second protective layer using the same material and process conditions as those in step S5. In the present embodiment, the material of the top water-blocking layer is the same as that of the water-blocking layer.

Afterward, the flexible display panel of the present embodiment is obtained.

In other embodiments, the protective layer and the encapsulation layer can be repeatedly deposited multiple times in response to different product requirements, which can continuously improve the folding strength and water resistance of the flexible display panel. However, the top layer is the inorganic water blocking layer regardless of its structure.

In view of the above, the film formed by poly(tetrafluoro-p-xylene) (TFPX) has the excellent water resistance and corrosion resistance, and can be made as the ultra-thin, transparent non-porous film by CVD. The thin film formed by poly(tetrafluoro-p-xylene) has the high transparency, excellent water resistance and corrosion resistance, and can be plated on the anode to form the micro-cavity adjustment layer to improve the light effect of the OLED device. In addition, the poly(tetrafluoro-p-xylene) with the excellent water resistance is also the good packaging material, which can be applied to the flexible OLED packaging. The present disclosure discloses applying $AF_4$ to the preparation of the micro-cavity adjustment layer, the cathodic protective layer, and the encapsulation layer of the flexible OLED by changing the process conditions, which improves the device lightening effect, enhances the water resistance of the packed layer, reduces the driving voltage to improve the device operating stability. At the same time, the difficulty of the process can also be reduced without the need to replace the raw materials, and the numeral processes can be completed in one chamber of CVD, which greatly reduces the OLED process steps.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of flexible display panels, comprising:
    forming an anode layer on a substrate, wherein
    forming a polymer on the anode layer from vapor of an organic dimer as a micro-cavity adjusting layer by a chemical vapor deposition method at a controlled temperature between 650° C. to 750° C.; and the structural formula of the organic dimer is as shown in Formula 1,

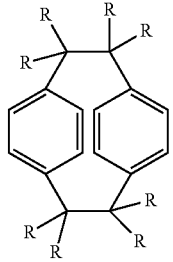

Formula 1 wherein R is selected from one of H, F, Cl, and Br;
    forming a hole injection layer on the micro-cavity adjustment layer;
    forming an organic emission layer on the hole injection layer;
    forming an electron transport layer on the organic emission layer; and
    forming a cathode layer on the electron transport layer.

2. The manufacturing method as claimed in claim 1, further comprising depositing the organic dimer on the cathode layer as a cathodic protective layer by a chemical vapor deposition method at a controlled temperature between 100° C. to 150° C.

3. The manufacturing method as claimed in claim 2, further comprising:
    preparing a protective layer preparation: forming n protective layers on the cathodic protective layer, n being an integer greater than 0, the protective layer comprising a water-blocking layer and a buffer layer sequentially deposited from bottom to top, and a top water-blocking layer is deposited on the n-th layer of the protective layer.

4. The manufacturing method as claimed in claim 3, further comprising the step of preparing an encapsulation layer by depositing the organic dimer on the protecting layer by a chemical vapor deposition method at a controlled temperature between 100° C. to 150° C.

5. The manufacturing method as claimed in claim 4, wherein the chemical vapor deposition method is one of plasma enhanced chemical vapor deposition, high density plasma chemical vapor deposition, and inductively coupled plasma chemical vapor deposition.

6. The manufacturing method as claimed in claim 3, wherein the chemical vapor deposition method is one of plasma enhanced chemical vapor deposition, high density plasma chemical vapor deposition, and inductively coupled plasma chemical vapor deposition.

7. The manufacturing method as claimed in claim 2, wherein the chemical vapor deposition method is one of plasma enhanced chemical vapor deposition, high density plasma chemical vapor deposition, and inductively coupled plasma chemical vapor deposition.

8. The manufacturing method as claimed in claim 1, wherein the chemical vapor deposition method is one of plasma enhanced chemical vapor deposition, high density plasma chemical vapor deposition, and inductively coupled plasma chemical vapor deposition.

9. A flexible display panel, comprising:
a substrate, an anode layer, a micro-cavity adjustment layer, a hole injection layer, an organic emission layer, an electron transport layer and a cathode layer arranged in sequence, wherein the micro-cavity adjustment layer is made by a polymer formed by an organic dimer, and the organic dimer and the formed polymer are respectively represented by Formula 1 and Formula 2, Formula 1

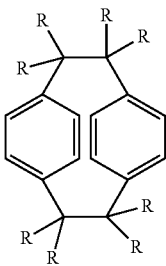

Formula 2

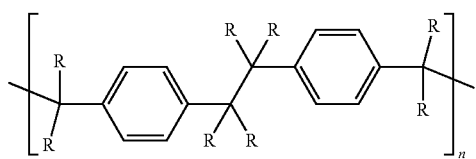

wherein R is selected from one of H, F, Cl, and Br.

10. The flexible display panel as claimed in claim 9, further comprising a cathode protective layer deposited on the cathode layer, and the material of the cathode protective layer being an organic dimer as shown in Formula 1.

11. The flexible display panel as claimed in claim 10, further comprising n protective layers sequentially deposited on the cathode protective layer, n being an integer greater than 0; a top water-blocking layer deposited on an n-th layer of the n protective layers; and the protective layers comprising a buffer layer and a water-blocking layer arranged in an upper layer and a lower layer.

12. The flexible display panel as claimed in claim 11, further comprising a encapsulation layer provided on the protective layers, the material of the encapsulation layer being the organic dimer as shown in Formula 1.

13. The flexible display panel as claimed in claim 12, wherein a thickness of the micro-cavity adjustment layer, the cathode protective layer, and the encapsulation layer is 0.1 to 10 μm.

14. The flexible display panel as claimed in claim 11, wherein a thickness of the micro-cavity adjustment layer, the cathode protective layer, and an encapsulation layer is 0.1 to 10 μm.

15. The flexible display panel as claimed in claim 10, wherein a thickness of the micro-cavity adjustment layer, the cathode protective layer, and an encapsulation layer is 0.1 to 10 μm.

16. The flexible display panel as claimed in claim 9, wherein a thickness of the micro-cavity adjustment layer, a cathode protective layer, and an encapsulation layer is from 0.1 to 10 μm.

* * * * *